(12) United States Patent
Okada et al.

(10) Patent No.: US 8,729,562 B2
(45) Date of Patent: May 20, 2014

(54) SEMICONDUCTOR DEVICE AND METHOD FOR MANUFACTURING SAME

(75) Inventors: Masaya Okada, Itami (JP); Makoto Kiyama, Itami (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

(21) Appl. No.: 13/498,767

(22) PCT Filed: Jun. 24, 2010

(86) PCT No.: PCT/JP2010/060738
§ 371 (c)(1),
(2), (4) Date: Mar. 28, 2012

(87) PCT Pub. No.: WO2011/043110
PCT Pub. Date: Apr. 14, 2011

(65) Prior Publication Data
US 2012/0181548 A1    Jul. 19, 2012

(30) Foreign Application Priority Data
Oct. 8, 2009 (JP) ................. 2009-234548

(51) Int. Cl.
*H01L 29/15* (2006.01)
(52) U.S. Cl.
USPC ................. 257/76; 257/13; 257/14
(58) Field of Classification Search
USPC ............... 257/13, 14, 76
See application file for complete search history.

(56) References Cited

U.S. PATENT DOCUMENTS

| | | | | |
|---|---|---|---|---|
| 2005/0145883 A1* | 7/2005 | Beach et al. | ................. | 257/194 |
| 2006/0220060 A1* | 10/2006 | Nakata et al. | ................. | 257/189 |
| 2010/0006894 A1* | 1/2010 | Ohta et al. | ................. | 257/192 |

FOREIGN PATENT DOCUMENTS

| | | |
|---|---|---|
| JP | 2004-260140 | 9/2004 |
| JP | 2006-286942 | 10/2006 |
| JP | 2008-041834 | 2/2008 |
| JP | 2008-053449 | 3/2008 |
| JP | 2008-091595 | 4/2008 |

* cited by examiner

*Primary Examiner* — David Vu
*Assistant Examiner* — Brandon Fox
(74) *Attorney, Agent, or Firm* — Venable LLP; Michael A. Sartori; Tamatane J. Aga (57) ABSTRACT

There are provided a high current semiconductor device that has low on-resistance, high mobility, and good pinch-off characteristics and in which a kink phenomenon is not easily caused even if a drain voltage is increased, and a method for producing the semiconductor device. The semiconductor device of the present invention includes a GaN-based layered body 15 having an opening 28, a regrown layer 27 including a channel, a gate electrode G, a source electrode S, and a drain electrode D. The regrown layer 27 includes an electron transit layer 22 and an electron supply layer 26. The GaN-based layered body includes a p-type GaN layer 6 whose end surface is covered by the regrown layer in the opening, and a p-side electrode 11 that is in ohmic contact with the p-type GaN layer is disposed.

4 Claims, 5 Drawing Sheets

SEMICONDUCTOR DEVICE AND METHOD FOR MANUFACTURING SAME

TECHNICAL FIELD

The present invention relates to a semiconductor device used for high power switching and a method for producing the semiconductor device, and particularly to a semiconductor device that uses a GaN-based semiconductor among nitride semiconductors and a method for producing the semiconductor device.

BACKGROUND ART

High reverse breakdown voltage and low on-resistance are required for high current switching elements. Field effect transistors (FETs) that use a group III nitride semiconductor are superior in terms of high breakdown voltage and high-temperature operation because of their large band gap. In particular, vertical transistors that use a GaN-based semiconductor have been receiving attention as transistors for controlling high power. For example, there has been proposed a vertical GaN-based FET whose mobility is increased and whose on-resistance is decreased by forming an opening in a GaN-based semiconductor and forming a regrown layer including a channel of two-dimensional electron gas (2DEG) on the wall surface of the opening (PTL 1). In this vertical GaN-based FET, a structure including a p-type GaN-based semiconductor layer for improving pinch-off characteristics is proposed.

CITATION LIST

Patent Literature

PTL 1: Japanese Unexamined Patent Application Publication No. 2006-286942

SUMMARY OF INVENTION

Technical Problem

In the above-described vertical GaN-based FET, the pinch-off characteristics may be improved. However, if a drain voltage is increased to increase a drain current, a kink phenomenon in which a runaway phenomenon such as an increase in the drain current in a saturation region of drain current-drain voltage characteristics is caused is highly likely to occur.

An object of the present invention is to provide a high current semiconductor device that has low on-resistance, high mobility, and good pinch-off characteristics and in which a kink phenomenon is not easily caused even if a drain voltage is increased, and a method for producing the semiconductor device.

Solution to Problem

A semiconductor device of the present invention includes a GaN-based layered body having an opening, a regrown layer that includes a channel and is epitaxially grown so as to cover the opening of the GaN-based layered body, a gate electrode located on the regrown layer in the opening, a source electrode located on the GaN-based layered body around the opening so as to be in contact with the regrown layer, and a drain electrode located so that the drain electrode and the source electrode sandwich the channel, the drain electrode being apart from the source electrode in a thickness direction of the GaN-based layered body. In the semiconductor device, the regrown layer includes an electron transit layer and an electron supply layer; the channel is a two-dimensional electron gas formed in the electron transit layer at an interface between the electron transit layer and the electron supply layer; the GaN-based layered body includes a p-type GaN-based semiconductor layer whose end surface is covered by the regrown layer on a wall surface of the opening; and a p-side electrode that is in ohmic contact with the p-type GaN-based semiconductor layer is disposed.

Since the channel is a two-dimensional electron gas (2DEG) in the configuration above, layers other than the p-type GaN-based semiconductor layer in the GaN-based layered body are composed of an n-type or i-type GaN-based semiconductor. In particular, a surface layer of the GaN-based layered body is composed of a high-density $n^+$-type GaN-based semiconductor layer because the source electrode is in ohmic contact with the surface layer. Therefore, the p-type GaN-based semiconductor layer is sandwiched between the $n^+$-type GaN-based semiconductor layer on the surface layer side and an $n^-$-type GaN-based semiconductor layer with a relatively low density in which electrons drift.

In the above-described configuration, the p-type GaN-based semiconductor layer produces the following effects.
(1) improvement in pinch-off characteristics due to the shift of a band in a positive direction
(2) improvement in breakdown voltage characteristics in a vertical direction
(3) prevention of a kink phenomenon through the formation of the p-side electrode The effects (1) and (2) can be produced due to a so-called back-gate effect without the p-side electrode, that is, because of the fact that a p-type semiconductor is used. However, by disposing the p-side electrode that is in ohmic contact with the p-type GaN-based semiconductor layer, holes generated in a region between the channel and the drain electrode when a drain voltage is increased can be extracted to the outside and thus the effect (3) can be produced. In other words, the p-side electrode can attract holes in the p-type GaN-based semiconductor layer and extract the holes to the outside. The effect (3) will now be described in detail.

In the case where the p-side electrode is not present, when a drain voltage is increased, a high electric field region is formed on the drain side of the channel even if the p-type GaN-based semiconductor layer is disposed. Consequently, avalanche breakdown is caused by high-energy electrons and a large number of holes are generated. Since GaN-based semiconductors have a wide band gap, the recombination time constant is large and holes are stored in the GaN-based layered body. The GaN-based semiconductor layer is not grounded in terms of the Fermi level of holes. When holes are stored, the potential near the channel is decreased and the electron concentration of a conduction band is increased. This causes a runaway phenomenon such as an increase in a drain current in a saturation region of drain current-drain voltage characteristics.

Even if a large number of holes are generated due to avalanche breakdown, such holes can be extracted to the outside through the p-side electrode disposed in the p-type GaN-based semiconductor layer. Thus, the storage of holes is cleared and a kink phenomenon can be prevented.

By disposing the p-side electrode, the p-type GaN-based semiconductor layer can produce not only the effects (1) and (2) but also the effects (1) to (3) described above. In the vertical GaN-based FET, a so-called effect of killing three birds with one stone can be produced. As a result, the degree of freedom is increased by overcoming the restrictions such as a kink phenomenon and breakdown voltage characteristics in a vertical direction, whereby 2DEG formed on the wall surface of the opening is caused to flow in a vertical direction and thus high electric current can be controlled.

The p-type GaN-based semiconductor layer may be a p-type GaN layer or a p-type AlGaN layer. In the case where a p-type AlGaN layer is employed, the band can be further shifted in a positive direction and thus the pinch-off characteristics can be further improved. The carrier density of the p-type GaN-based semiconductor layer is normally about $5 \times 10^{16}$ cm$^{-3}$. As described below, a p$^+$-type GaN-based semiconductor layer having high carrier density may be used to improve the back-gate effect.

The GaN-based layered body is formed on a predetermined crystal face of GaN through epitaxial growth. The base composed of GaN may be a GaN substrate or a GaN film formed on a supporting base. Furthermore, by growing the GaN-based layered body on a GaN substrate or the like and reducing the thickness of the GaN substrate or the like to a certain degree in the step performed later, only a thin GaN layer base may be left in a product state. The thin GaN layer base may be conductive or nonconductive, and a drain electrode can be formed on a top or bottom surface of the thin GaN layer base depending on the production process and the structure of products.

When the GaN substrate or the supporting base is left in a product, the supporting base or the substrate may be conductive or nonconductive. In the case of being conductive, a drain electrode can be directly formed on the bottom surface (lower surface) or the top surface (upper surface) of the supporting base or the substrate. In the case of being nonconductive, a drain electrode can be formed on a conductive layer that is located on the lower layer side of the semiconductor layer, the drain electrode being formed above the nonconductive substrate.

The p-side electrode may be present inside the source electrode when viewed in plan, may penetrate so as to extend between the p-type GaN-based semiconductor layer and the source electrode, and may be in ohmic contact with the source electrode. This allows the p-side electrode to be embedded below the source electrode, and the p-side electrode and the source electrode have a common potential such as a ground potential. Other wiring lines used only for the p-side electrode are not required. Therefore, a p-side electrode having a simple structure can be provided and such a p-side electrode can be produced with a simple change of process. Since the p-side electrode is embedded below the source electrode, an area does not increase. Thus, the vertical GaN-based FET can be downsized and low on-resistance can be achieved.

The p-side electrode (in ohmic contact with the p-type GaN-based semiconductor layer) that penetrates through the GaN-based layered body on the p-type GaN-based semiconductor layer and is in ohmic contact with the source electrode may be composed of a metal or a p$^+$-type GaN-based semiconductor.

An insulating layer may be formed on the regrown layer and below the gate electrode. By forming the insulating layer below the gate electrode, the gate leakage current generated when a positive voltage is applied to the gate electrode can be suppressed, which allows high-current operation. Since the threshold voltage can be further shifted in a positive direction, normally-off operation is easily achieved.

A method for producing a semiconductor device of the present invention includes a step of forming a GaN-based layered body including a p-type GaN-based semiconductor layer on a predetermined crystal face of GaN; a step of forming an opening in the GaN-based layered body by etching, the opening penetrating the p-type GaN-based semiconductor layer; a step of epitaxially growing a regrown layer in the opening of the GaN-based layered body, the regrown layer including an electron transit layer and an electron supply layer; a step of making a vertical hole that extends from a surface around the opening to the p-type GaN-based semiconductor layer and then forming a conductive portion by filling the vertical hole with a conductive material; and a step of forming a source electrode so that the source electrode is electrically in contact with the conductive portion and the regrown layer in the opening.

With this method, the p-side electrode is embedded below the source electrode, and the p-side electrode or conductive portion having a common potential, such as a ground potential, together with the source electrode can be formed with a simple process. Except for the conductive portion, other wiring lines used only for the p-side electrode are not required. Therefore, the p-side electrode can be produced with a simple change of process.

Advantageous Effects of Invention

According to the present invention, there can be provided a high current semiconductor device that has low on-resistance, high mobility, and good pinch-off characteristics and in which a kink phenomenon is not easily caused even if a drain voltage is increased, and a method for producing the semiconductor device.

DESCRIPTION OF EMBODIMENTS

Figure 1:
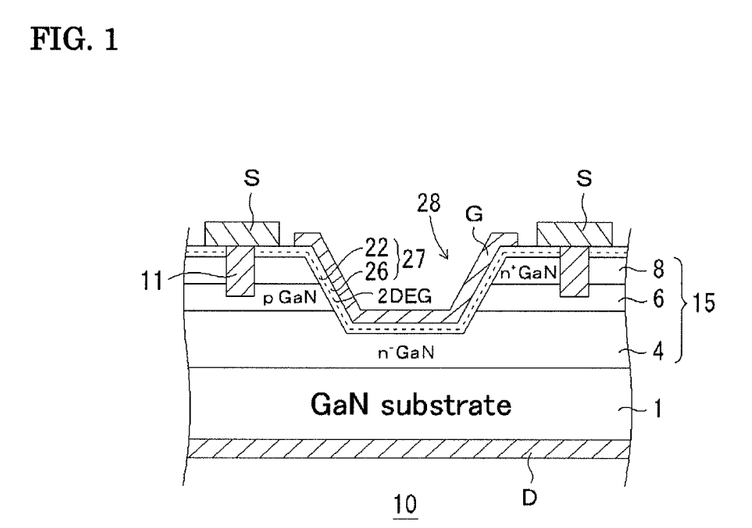
FIG. 1 is a sectional view showing a vertical GaN-based FET according to an embodiment of the present invention.

FIG. 1 is a sectional view of a vertical GaN-based FET 10 according to an embodiment of the present invention. The vertical GaN-based FET 10 includes a conductive GaN substrate 1 and n$^-$-type GaN drift layer 4/p-type GaN layer 6/n$^+$-type cap layer 8 epitaxially grown thereon. The n$^-$-type GaN drift layer 4/p-type GaN layer 6/n$^+$-type cap layer 8 is successively formed to constitute a GaN-based layered body 15. A buffer layer composed of an AlGaN layer or GaN layer may be inserted between the GaN substrate 1 and the n$^-$-type GaN drift layer 4 depending on the type of the GaN substrate 1.

The GaN substrate 1 may be a substrate including a GaN layer that is in ohmic contact with a supporting base. In a product state, as described above, by reducing the thickness of the GaN substrate or the like to a certain degree, only a thin GaN layer may be left as a base film for the epitaxial growth of a GaN-based layered body. The GaN substrate, the substrate including a GaN layer that is in ohmic contact with a supporting base, and the thin GaN layer left as a base in a product state may be simply referred to as a GaN substrate.

The p-type GaN layer 6 is used as a p-type GaN-based semiconductor layer in this embodiment, but a p-type AlGaN layer may be used instead.

In the GaN-based layered body 15, an opening 28 is formed so as to penetrate the p-type GaN layer 6 and reach the n⁻-type GaN drift layer 4. A regrown layer 27 is formed by epitaxial growth so as to cover the wall surface of the opening 28 and the surface of the GaN-based layered body 15. The regrown layer 27 is constituted by an intrinsic GaN (iGaN) electron transit layer 22 and an AlGaN electron supply layer 26. An intermediate layer composed of AlN or the like may be inserted between the iGaN electron transit layer 22 and the AlGaN electron supply layer 26. A gate electrode G is located on the regrown layer 27 and a drain electrode D is located on the bottom surface of the GaN substrate 1. A source electrode S is in ohmic contact with the regrown layer 27 above the GaN-based layered body 15. In FIG. 1, the source electrode S is located on the regrown layer 27 so as to be in contact with the regrown layer 27. However, the source electrode S may be in ohmic contact with the end surface of the regrown layer 27 while it is located on the n⁺-type cap layer 8 so as to be in contact with the n⁺-type cap layer 8.

In the vertical GaN-based FET 10 of this embodiment, electrons flow in a thickness direction or a vertical direction from the source electrode S to the drain electrode D through the electron transit layer 22 and the n⁻-type GaN drift layer 4. In this path of electrons, the p-type GaN layer 6 is sandwiched between the n⁻-type GaN drift layer 4 and the n⁺-type cap layer 8. Although electrons do not flow in the p-type GaN layer 6, the p-type GaN layer 6 raises the band energy of electrons and produces a back-gate effect which, for example, improves breakdown voltage characteristics.

This embodiment is characterized in that the p-type GaN layer 6 is disposed so as to be embedded below the source electrode S and furthermore a conductive portion 11 that is in ohmic contact with the p-type GaN layer 6 and the source electrode S is disposed. The conductive portion 11 penetrates through the n⁺-type cap layer 8, reaches the p-type GaN layer 6, and is in ohmic contact with the p-type GaN layer 6. Because of the presence of the conductive portion 11, the p-type GaN layer 6 and the source electrode S have a common potential, and the potential of the p-type GaN layer 6 is fixed to, for example, a ground potential. In the description below, the conductive portion 11 may be referred to as a p-side electrode 11.

The p-type GaN layer 6 produces the following effects as described above.
(1) improvement in pinch-off characteristics due to the shift of a band in a positive direction
(2) improvement in breakdown voltage characteristics in a vertical direction
(3) prevention of a kink phenomenon through the formation of the p-side electrode 11

The effects (1) and (2) can be produced due to the above-described back-gate effect without the p-side electrode 11. However, by disposing the p-side electrode 11 that is in ohmic contact with the p-type GaN layer 6, holes generated in a region between a channel and the drain electrode when a drain voltage is increased can be extracted to the outside and thus the effect (3) can be produced. The effect (3) will now be described in detail.

In the case where the p-side electrode 11 is not present, when a drain voltage is increased, a high electric field region is formed on the drain side of the channel even if the p-type GaN layer 6 is disposed. Consequently, avalanche breakdown is caused by high-energy electrons and holes are generated in a high concentration. Since GaN-based semiconductors have a wide band gap, the recombination time constant is large and holes are stored in a high concentration in the GaN-based layered body 15, particularly in the n⁻-type GaN drift layer 4. This causes a runaway phenomenon such as an increase in a drain current in a saturation region of drain current-drain voltage characteristics. Even if a large number of holes are generated due to avalanche breakdown, such holes can be extracted to the outside through the p-side electrode 11 disposed in the p-type GaN layer 6. Thus, a kink phenomenon can be prevented.

By disposing the p-side electrode 11, the p-type GaN layer 6 can produce the above-described effects (1) to (3). As a result, in the vertical GaN-based FET 10, the degree of freedom is increased by overcoming the restrictions such as a kink phenomenon and breakdown voltage characteristics in a vertical direction, whereby 2DEG formed in the opening is caused to flow in a vertical direction and thus high electric current can be controlled.

Figure 2:
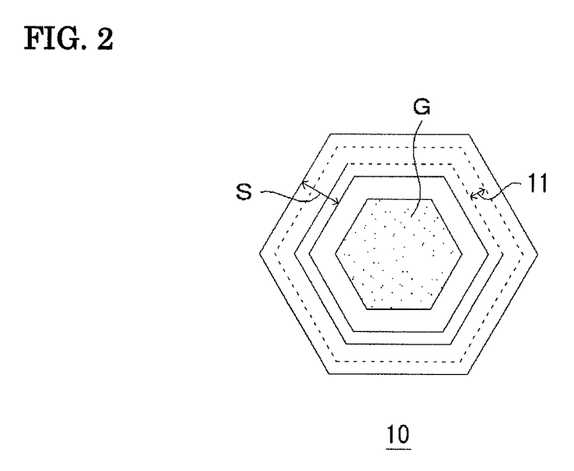
FIG. 2 is a plan view of the vertical GaN-based FET shown in FIG. 1.

FIG. 2 is a plan view of the vertical GaN-based FET 10 shown in FIG. 1. In this plan view, the vertical GaN-based FET 10 has a hexagonal shape and can be two-dimensionally arranged in a dense manner. Furthermore, the ring-shaped hexagonal p-side electrode 11 or conductive portion 11 is completely covered with the ring-shaped hexagonal source electrode S. That is, the p-type GaN layer 6 is electrically connected to the source electrode S without disposing any additional portion when viewed in plan. Therefore, a kink phenomenon can be prevented while the vertical GaN-based FET 10 is two-dimensionally arranged in a dense manner and the size is kept small. The embedded conductive portion 11 can be formed with a simple process as long as attention is paid to the etching time so that the conductive portion 11 reaches the p-type GaN layer 6.

The n⁻-type GaN drift layer 4 preferably has a thickness of 1 to 25 μm and a carrier density of $0.2 \times 10^{16}$ to $20.0 \times 10^{16}$ cm⁻³, for example. The p-type GaN layer 6 preferably has a thickness of 0.1 to 10 μm and a carrier density of $0.5 \times 10^{16}$ to $50 \times 10^{16}$ cm⁻³. When importance is attached to the function of the p-type GaN layer 6 due to a back-gate effect, the carrier density can be increased to $1 \times 10^{17}$ to $1 \times 10^{19}$ cm⁻³. The n⁺-type GaN cap layer 8 preferably has a thickness of 0.1 to 3 μm and a carrier density of $1.0 \times 10^{17}$ to $30.0 \times 10^{17}$ cm⁻³.

In the regrown layer 27, the electron transit layer 22 preferably has a thickness of about 5 to 100 nm and the electron supply layer 26 preferably has a thickness of about 1 to 100 nm. If the thickness of the electron transit layer 22 is less than 5 nm, the distance between 2DEG and the interface of electron supply layer 26/electron transit layer 22 becomes excessively small, which decreases the mobility in 2DEG. If the thickness of the electron transit layer 22 is more than 100 nm, the effect of the p-type GaN layer 6 degrades and thus the pinch-off characteristics degrade. Therefore, the thickness is set to be 100 nm or less.

—Production Method—

Figure 3A:
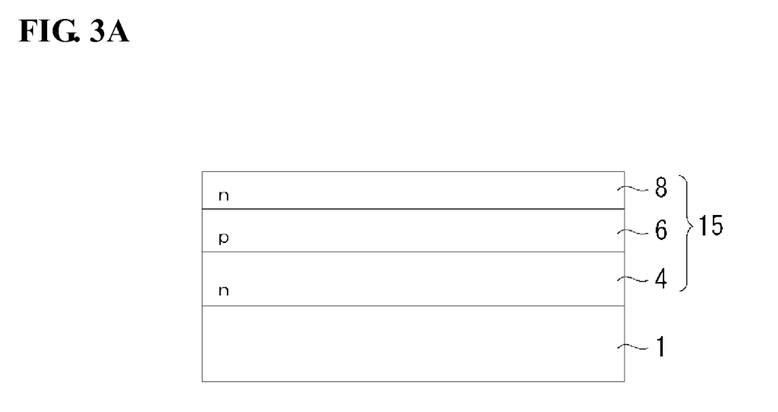
FIG. 3A is a diagram showing a method for producing the vertical GaN-based FET in FIG. 1, the diagram showing the state in which an epitaxial layered body including layers up to a cap layer is formed on a substrate including a GaN layer that is in ohmic contact with a supporting base.

A method for producing the vertical GaN-based semiconductor device 10 according to this embodiment will now be described. First, as shown in FIG. 3A, a layered body of n⁻-type GaN drift layer 4/p-type GaN layer 6/n⁺-type GaN cap layer 8 is epitaxially grown on a GaN substrate 1 or a substrate 1 including a GaN layer that is in ohmic contact with a supporting base. These layers are formed by, for example, metal-organic chemical vapor deposition (MOCVD). Alternatively, molecular beam epitaxy (MBE) may be used instead of MOCVD. Thus, a GaN-based semiconductor layer having high crystallinity can be formed. The thickness and carrier density of each of the layers are as follows. The n⁻-type GaN drift layer 4 has a thickness of 5.0 μm and a carrier density of $5.0 \times 10^{15}$ cm⁻³.

The p-type GaN layer 6 has a thickness of 0.5 μm and a carrier density of $5.0 \times 10^{18}$ cm⁻³. The n⁺-type GaN cap layer 8 has a thickness of 0.3 μm and a carrier density of $5.0 \times 10^{17}$ cm⁻³.

Figure 3B:
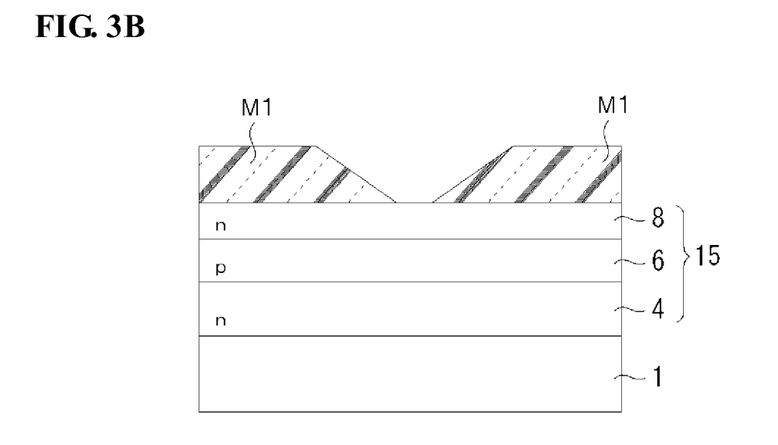
FIG. 3B is a diagram showing a method for producing the vertical GaN-based FET in FIG. 1, the diagram showing the state in which a resist pattern is formed to form an opening.

As shown in FIG. 3B, a resist mask M1 is then formed in a predetermined region on the n⁺-type GaN cap layer 8 using a conventional photolithography. In this resist mask M1 formed herein, the planar shape is hexagonal and the sectional shape is trapezoidal (mesa shape).

Figure 4A:
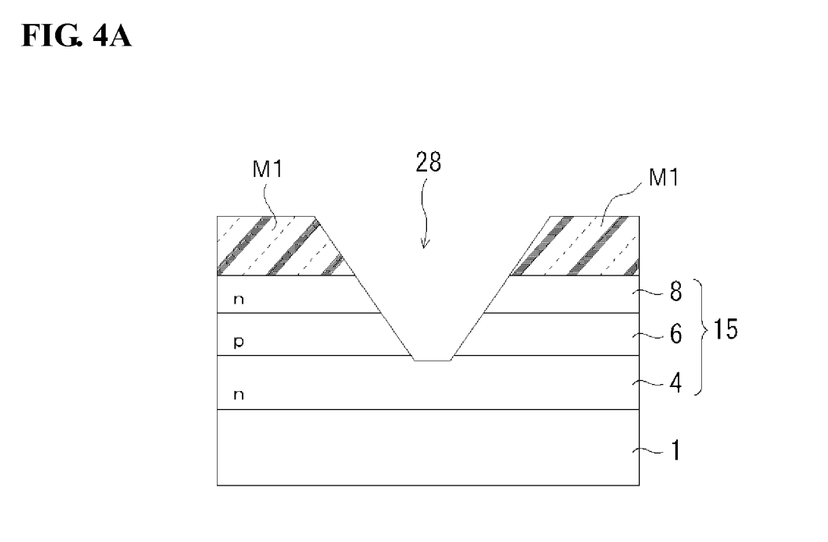
FIG. 4A is a diagram showing the state in which the opening is formed by etching.

Subsequently, as shown in FIG. 4A, the n⁺-type GaN cap layer 8, the p-type GaN layer 6, and part of the n⁻-type GaN drift layer 4 are etched by reactive ion etching (RIE) that uses high-density plasma generated through inductively coupled plasma, to form an opening 28. As a result, the end surfaces of the n⁺-type GaN cap layer 8, the p-type GaN layer 6, and the n⁻-type GaN drift layer 4 are exposed in the opening 28 and constitute a wall surface of the opening. At this point, the wall surface of the opening 28 is damaged by the etching, and the damage extends up to a depth of several nanometers (about 1 to 20 nm). The wall surface of the opening 28 is a surface inclined by about 10 to 90° relative to the substrate surface. The angle of the inclined surface relative to the substrate surface can be controlled by adjusting the gas pressure of chlorine gas used in RIE and the flow ratio between the chlorine gas and other gases. After the completion of RIE, washing with an organic solvent is performed and the resist mask M1 is removed by ashing or the like.

Anisotropic wet etching (at 80° C., for several minutes to several hours) is then performed on the wall surface of the opening using a tetramethylammonium hydroxide (TMAH) aqueous solution as an etchant. The etching damage caused on the wall surface of the opening 28 by RIE that uses high-density plasma is removed by anisotropic wet etching. At the same time, the m faces of the n⁺-type GaN cap layer 8 and the p-type GaN layer 6 are exposed on part of the end surfaces of the respective layers.

In the side surface of the opening 28, a plurality of surfaces $S_1$ that are substantially perpendicular to the substrate surface and inclined surfaces $S_3$ that are formed so as to complement the areas between the surfaces $S_1$ are formed in a mixed manner in the inclination direction (inclination angle θ) of the side surface of the opening. In the vertical FET 10, when the GaN substrate 1 whose main surface is a {0001} face is used, a hexagonal GaN layer and an AlGaN layer are epitaxially grown using the {0001} face (hereinafter referred to as "C face") as a growth face. Thus, each of the perpendicular surfaces $S_1$ on the n⁺-type GaN cap layer 8 is a {1-100} face (hereinafter referred to as "m face"). The m face is a nonpolar face unlike the C face. By regrowing a GaN electron transit layer 22 and an AlGaN electron supply layer 26 using the m face as a growth face, a polarization charge such as a piezoelectric charge is not generated at the heterointerface of AlGaN 26/GaN 22. Therefore, an electric field is not generated in a direction in which the minimum energy of a channel is decreased. This can further improve the pinch-off characteristics.

As the inclination angle θ of the wall surface of the opening 28 shown in FIG. 4(a) or the like approaches 90 degrees, the ratio of the m face or surface $S_1$ that occupies the wall surface increases. Thus, to further improve the pinch-off characteris-tics in the vertical FET 10, the inclination angle θ is preferably close to 90 degrees and is suitably 60 degrees or more, for example.

The depth of the etching damage is dependent on the conditions of RIE treatment. The ratio of the m face relative to the boundary surface of the opening is dependent on the configuration of the vertical FET 10 produced. Therefore, in consideration of such conditions, the anisotropic etching may be performed under the etching conditions that etching damage can be removed and desired characteristics is achieved. The etchant for anisotropic wet etching is not limited to the TMAH aqueous solution. The etchant may be suitably selected in accordance with the material of the substrate.

Figure 4B:
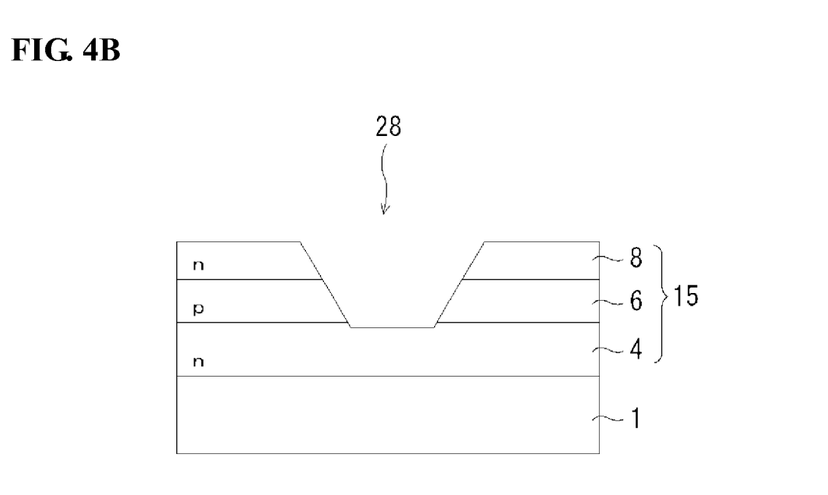
FIG. 4B is a diagram showing the state in which a resist pattern is removed and the opening is further etched.

In FIG. 4(b), the planar shape of the opening 28 is hexagonal as shown in FIG. 2.

Figure 5:
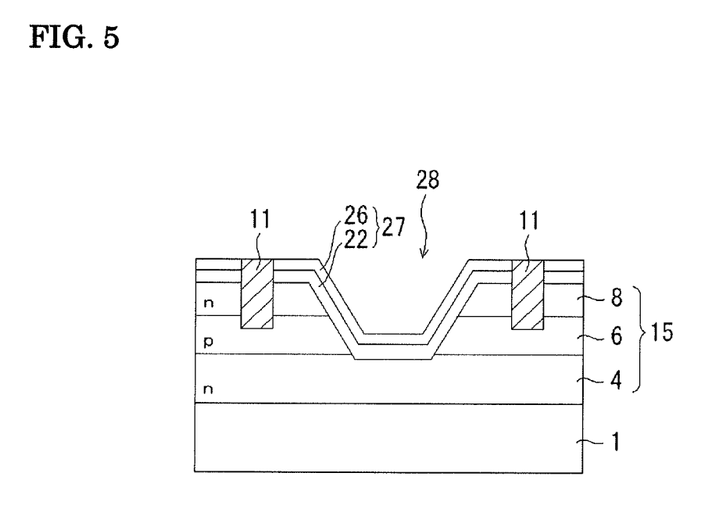
FIG. 5 is a diagram showing the state in which a regrown layer is formed in the opening, a hole is made, and the hole is filled to form a conductive portion.

Next, as shown in FIG. 5, a GaN electron transit layer 22 and an AlGaN electron supply layer 26 that constitute the regrown layer 27 are formed on the wall surface of the opening 28 and on the GaN-based layered body 15 located around the opening 28. An AlN intermediate layer may be inserted between the GaN electron transit layer 22 and the AlGaN electron supply layer 26. In the growth of the regrown layer 27, first, a GaN electron transit layer 22 to which impurities are not added is formed by MOCVD. The growth temperature during MOCVD is set to be 1020° C. In the case where the AlN intermediate layer is inserted, the growth temperature is then set to be 1080° C. to form the AlN intermediate layer and the AlGaN electron supply layer 26. Thus, a regrown layer 27 constituted by the electron transit layer 22, the AlN intermediate layer, and the electron supply layer 26 is formed along the surface of the opening 28. For example, the GaN electron transit layer 22 has a thickness of 100 nm, the AlN intermediate layer has a thickness of 1 nm, and the AlGaN electron supply layer 26 has a thickness of 24 nm. The composition ratio of Al in the AlGaN electron supply layer 26 is 25%.

To avoid a decrease in the growth rate on the wall surface of the opening 28, the regrowth is preferably performed at a temperature lower than the growth temperature of the GaN-based layered body 15 and at a high VIII ratio. Furthermore, an increase in the growth temperature from the formation of the electron transit layer 22 to the formations of the intermediate layer and the electron supply layer 26 is preferably performed within a short time to reduce the damage to crystal surfaces. For example, the temperature is preferably increased within 20 minutes. Note that MBE may be used instead of MOCVD.

Subsequently, a pattern of a conductive portion 11 is formed using a resist M by the same formation method as that of the opening 28, and a hole that reaches the p-type GaN layer 6 is formed by dry etching using the resist M as a mask. The resist M is removed, a new resist pattern is formed, an electrode metal is formed by vapor deposition, and a conductive portion 11 is formed by liftoff. Alloy annealing is then performed to achieve the ohmic contact between the p-type GaN layer and the conductive portion. The conductive portion 11 has a ring-shaped hexagonal shape shown in FIG. 2 when viewed in plan.

Subsequently, a source electrode S, a gate electrode G, and a drain electrode D are formed. A ring-shaped hexagonal source electrode S is formed so as to be electrically connected to the ring-shaped hexagonal conductive portion 11 or p-side electrode 11. In the formation of the source electrode S, first, a photoresist having an opening is formed in a predetermined region by a conventional photolithography. After an electrode is formed by vapor deposition, a Ti/Al film is formed on a flat surface of the n⁺-type GaN cap layer 8 or regrown layer 27 by liftoff. Subsequently, heat treatment is performed in a nitrogen atmosphere at 800° C. for 30 seconds. Thus, an alloy layer is formed at the interface between the Ti/Al film and the n$^+$-type GaN cap layer 8 or regrown layer 27. As a result, a source electrode S having a satisfactory ohmic contact resistance of about 0.4 Ωmm can be formed.

Instead of Ti/Al, any metal may be used for the source electrode S as long as the metal is formed on the regrown layer 27 through ohmic contact. Before the Ti/Al is formed as a source electrode S by vapor deposition, the AlGaN electron supply layer 26 and the AlN intermediate layer are preferably removed by RIE that uses chlorine gas. In this case, there is no barrier against electrons by the intermediate layer, and thus the ohmic contact resistance can be reduced to 0.2 Ωmm.

In the formation of the gate electrode G, first, a photoresist having a predetermined opening is formed by a conventional photolithography. A Ni/Au film is then formed along the AlGaN electron supply layer 26, which has been formed in the opening 28, by vapor deposition and liftoff.

Instead of the Ni/Au, a metal that forms a Schottky junction with a GaN-based semiconductor such as Pt/Au, Pd/Au, or Mo/Au may also be used for the gate electrode G. Before the formation of the gate electrode G, an insulating film (not shown) such as a silicon oxide film may be formed along the AlGaN electron supply layer 26 in the opening 28 by CVD or sputtering so as to have a thickness of 10 nm. This can also provide a vertical FET having a MIS-HFET structure. Instead of the silicon oxide film, a silicon nitride film or an aluminum oxide film may be used as the insulating film.

After that, wiring layers (not shown) connected to the gate electrode G and the source electrode S are formed, and then an insulating film layer (not shown) is formed to protect the surface of a transistor. For example, a silicon nitride film, a silicon oxide film, or a silicon oxynitride film serving as the insulating film layer is formed so as to cover the entire surface of a transistor. An insulating film layer of a bonding pad portion (not shown) is also removed by RIE. Through the steps above, the production process of a wafer surface is completed.

In the formation of the drain electrode D, first, a wafer surface is protected with a photoresist. A Ti/Al film is formed, by vapor deposition, on the bottom surface of the substrate 1 including a GaN layer that is in ohmic contact with the supporting base. After the photoresist on the wafer surface is removed, a heat treatment is performed at 850° C. for 30 seconds. Thus, the substrate 1 including a GaN layer that is in ohmic contact with the supporting base and a metal of the drain electrode D are alloyed with each other so that the substrate 1 and the drain electrode D are in ohmic contact with each other. Through the steps described above, the vertical GaN-based FET 10 shown in FIG. 1 is completed.

Although the drain electrode D is formed on the bottom surface of the GaN substrate 1, the drain electrode D may be formed on a surface of the n$^-$-type GaN drift layer 4, the surface facing the source electrode S. For example, an n-type GaN contact layer is formed between the n$^-$-type GaN drift layer 4 and the GaN substrate 1, and a drain electrode connected to the contact layer from the surface side may be formed.

The structures of the embodiment of the present invention disclosed above are mere examples, and the scope of the present invention is not limited to that of the above description. It is to be understood that the scope of the present invention is defined in the appended claims and includes equivalence of the description of the claims and all changes within the scope of the claims.

INDUSTRIAL APPLICABILITY

According to the present invention, in a vertical GaN-based FET including a regrown layer with a channel on the wall surface of an opening, holes can be easily extracted to the outside by disposing, around the opening, a p-type GaN-based semiconductor layer including a p-side electrode. Consequently, a kink phenomenon is prevented. Furthermore, by employing an embedded structure in which the p-side electrode and the source electrode overlap each other when viewed in plan, the p-side electrode is electrically connected to the source electrode without disposing any additional portion in plan view while the size is kept small. Thus, for example, grounding can be achieved.

REFERENCE SIGNS LIST

1 GaN substrate
4 n$^-$-type GaN drift layer
6 p-type GaN layer
8 n$^+$-type GaN cap layer
10 vertical GaN-based FET
11 p-side electrode (conductive portion)
15 GaN-based layered body
22 GaN electron transit layer
26 AlGaN electron supply layer
27 regrown layer
28 opening
S source electrode
G gate electrode
D drain electrode
M1 resist pattern

The invention claimed is:

1. A semiconductor device comprising:
a GaN-based layered body having an opening;
a regrown layer that includes a channel and is epitaxially grown so as to cover the opening of the GaN-based layered body;
a gate electrode located on the regrown layer in the opening;
a source electrode located on the GaN-based layered body around the opening so as to be in contact with the regrown layer; and
a drain electrode located so that the drain electrode and the source electrode sandwich the channel, the drain electrode being apart from the source electrode in a thickness direction of the GaN-based layered body,
wherein the regrown layer includes an electron transit layer and an electron supply layer, and the channel is a two-dimensional electron gas formed in the electron transit layer at an interface between the electron transit layer and the electron supply layer;
the regrown layer separating the source electrode from the GaN-based layered body, and
the GaN-based layered body includes a p-type GaN-based semiconductor layer whose end surface is covered by the regrown layer on a wall surface of the opening, and a p-side electrode that is in ohmic contact with the p-type GaN-based semiconductor layer is disposed.

2. The semiconductor device according to claim 1, wherein the p-side electrode is present inside the source electrode when viewed in plan, penetrates so as to extend between the p-type GaN-based semiconductor layer and the source electrode, and is in ohmic contact with the source electrode.

3. The semiconductor device according to claim 1, wherein an insulating layer is formed on the regrown layer and below the gate electrode.

4. A method for producing a semiconductor device, the method comprising:

a step of forming a GaN-based layered body including a p-type GaN-based semiconductor layer on a predetermined crystal face of GaN;

a step of forming an opening in the GaN-based layered body by etching, the opening penetrating the p-type GaN-based semiconductor layer;

a step of epitaxially growing a regrown layer in the opening of the GaN-based layered body, the regrown layer including an electron transit layer and an electron supply layer;

a step of making a vertical hole that extends from a surface around the opening to the p-type GaN-based semiconductor layer and then forming a conductive portion by filling the vertical hole with a conductive material; and a step of forming a source electrode so that the source electrode is electrically in contact with the conductive portion and the regrown layer in the opening, the regrown layer separating the source electrode from the GaN-based layered body.

* * * * *